(12) United States Patent
Foreman et al.

(10) Patent No.: US 7,181,711 B2
(45) Date of Patent: Feb. 20, 2007

(54) PRIORITIZING OF NETS FOR COUPLED NOISE ANALYSIS

(75) Inventors: Eric A. Foreman, Fairfax, VT (US); Peter A. Habitz, Hinesburg, VT (US); Gregory M. Schaeffer, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 10/908,101

(22) Filed: Apr. 27, 2005

(65) Prior Publication Data

US 2006/0248485 A1 Nov. 2, 2006

(51) Int. Cl.
G06F 17/50 (2006.01)

(52) U.S. Cl. .......................... 716/6; 716/12

(58) Field of Classification Search .................. 716/2, 716/6, 12
See application file for complete search history.

(56) References Cited

U.S. PATENT DOCUMENTS

| | | | |
|---|---|---|---|
| 5,535,133 A | 7/1996 | Petschauer et al. | |
| 5,555,506 A | 9/1996 | Petschauer et al. | |
| 5,596,506 A | 1/1997 | Petschauer et al. | |
| 6,029,117 A | 2/2000 | Devgan | |
| 6,117,182 A | 9/2000 | Alpert et al. | |
| 6,253,359 B1 | 6/2001 | Cano et al. | |
| 6,363,516 B1 | 3/2002 | Cano et al. | |
| 6,378,109 B1 | 4/2002 | Young et al. | |
| 6,405,348 B1 | 6/2002 | Fallah-Tehrani et al. | |
| 6,480,998 B1 | 11/2002 | Mukherjee et al. | |
| 6,493,853 B1 | 12/2002 | Savithri et al. | |
| 6,499,131 B1 | 12/2002 | Savithri et al. | |
| 6,510,540 B1 | 1/2003 | Krauter et al. | |
| 6,523,149 B1 | 2/2003 | Mehrotra et al. | |
| 6,594,805 B1 | 7/2003 | Tetelbaum et al. | |
| 6,601,222 B1 | 7/2003 | Mehrotra et al. | |
| 6,615,395 B1 | 9/2003 | Hathaway et al. | |
| 6,651,229 B2 | 11/2003 | Allen et al. | |
| 6,718,530 B2 | 4/2004 | Kim et al. | |
| 6,721,929 B2 | 4/2004 | Li et al. | |
| 6,732,339 B2 | 5/2004 | Savithri et al. | |
| 6,766,264 B2 | 7/2004 | Jung et al. | |
| 6,799,153 B1 | 9/2004 | Sirichotiyakul et al. | |
| 6,836,873 B1 | 12/2004 | Tseng et al. | |
| 6,898,204 B2 * | 5/2005 | Trachewsky et al. | ....... 370/445 |
| 2002/0021135 A1 | 2/2002 | Li et al. | |
| 2002/0188577 A1 | 12/2002 | Vidhani et al. | |
| 2003/0070150 A1 | 4/2003 | Allen et al. | |
| 2003/0079191 A1 | 4/2003 | Savithri et al. | |

(Continued)

Primary Examiner—Thuan Do
(74) Attorney, Agent, or Firm—Gibb I.P. Law Firm, LLC; Richard M. Kotulak, Esq.

(57) ABSTRACT

A system and method of performing microelectronic chip timing analysis, wherein the method comprises identifying failing timing paths in a chip; prioritizing the failing timing paths in the chip according to a size of random noise events occurring in each timing path; attributing a slack credit statistic for all but highest order random noise events occurring in each timing path; and calculating a worst case timing path scenario based on the prioritized failing timing paths and the slack credit statistic. Preferably, the random noise events comprise non-clock events. Moreover, the random noise events may comprise victim/aggressor net groups belonging to different regularity groups. Preferably, the size of random noise events comprises coupled noise delta delays due to the random noise events occurring in the chip.

20 Claims, 3 Drawing Sheets

U.S. PATENT DOCUMENTS

| | | |
|---|---|---|
| 2003/0115563 A1 | 6/2003 | Chen |
| 2003/0159121 A1 | 8/2003 | Tseng |
| 2003/0227032 A1 | 12/2003 | Nawa et al. |
| 2003/0237066 A1 | 12/2003 | Ito |
| 2004/0019864 A1 | 1/2004 | Kim et al. |
| 2004/0024554 A1 | 2/2004 | Jung et al. |
| 2004/0060022 A1 | 3/2004 | Allen et al. |
| 2004/0078176 A1 | 4/2004 | Bowen et al. |
| 2004/0098684 A1 | 5/2004 | Amekawa |
| 2004/0103386 A1 | 5/2004 | Becer et al. |
| 2004/0205678 A1 | 10/2004 | Tuncer et al. |
| 2004/0205680 A1 | 10/2004 | Gyure et al. |
| 2004/0205682 A1 | 10/2004 | Gyure et al. |
| 2005/0022145 A1 | 1/2005 | Tetelbaum et al. |
| 2005/0060675 A1 | 3/2005 | Tetelbaum |

* cited by examiner

PRIORITIZING OF NETS FOR COUPLED NOISE ANALYSIS

BACKGROUND OF THE INVENTION

1. Field of the Invention

The embodiments of the invention generally relate to analyzing signal processing systems and, more particularly, to signal timing and noise analysis in electronic circuits.

2. Description of the Related Art

Full chip timing is typically performed using static timing tools, one net at a time. In this regard, a net is generally defined as a collection of electrical terminals all of which are electrically connected to one another. Static timing analysis is generally an exhaustive technique of analyzing, debugging, and validating the timing performance of a particular chip design. Usually, this is achieved by breaking down the entire design into sets of electrical timing paths. The signal delay on each path in the design is calculated and checked against the known timing parameters for any possible violation. Often, a circuit is affected by various types of noise. A net that is affected by noise is known as a victim net, while the neighboring nets which affect a victim net are known as aggressor nets. Typically, both victim nets and aggressor nets may each be embodied as a simple, point-to-point circuit comprised of a source and a sink, or it may be a more complex circuit.

Generally, for these static timing tools to work properly and efficiently the nets have to be decoupled, such that each net can be timed using a timing methodology without prior knowledge of the specific switching of the other nets. Coupling capacitances between nets cause the switching aggressor net to transfer current into the victim net it couples to, which can be switching or quiet. In either case, the underlying assumption in the timing tool that these coupled nets are independent is not necessarily valid.

Conventional adjustments to the timing methodology have been created to analyze the impact of simultaneous switching. Moreover, it has been determined that it is advantageous to be able to focus on those particular nets which are most likely to cause a problem and not be concerned about good (i.e., properly functioning) nets. Typically, many signal coupled noise events, such as cross-talk noise, accumulate to result in chip failure. For example, in digital chips, excessive cross-talk noise on a victim net can lead to logic failure or chip timing failure. In this regard, cross-talk noise is the noise induced by the parasitic coupling between on-chip wires. Each coupled noise event has a certain probability of occurring. For the noise event to impact timing, the aggressor and victim nets have to switch in the same clock cycle. On average, every net switches every fifth cycle or earlier. The probability that all possible coupling interactions occur simultaneously, within one circuit path, becomes very small with many aggressors. Furthermore, the direction of each noise event (i.e., whether the noise accelerates or decelerates the signal transition) is also random, further reducing the combined effect of many noise events within a timing path.

Based on extracted parasitic data alone, chip designers working with noise analysis tools have to assume the worst-case scenario for setting up the analysis conditions. For example, the analysis conditions may include if, when, and in which direction a signal can switch. The most pessimistic assumption is that any aggressor net or problem-causing signal will switch, and at the worst possible moment, and in the direction that causes the worst possible noise. Conventional noise analysis applies pessimistic assumptions to every noise event, resulting in tens of thousands of failing slacks on good and working chips. Many of these failing slacks can be considered false due to this pessimism. In this regard, noise slack is defined as the noise margin at a sink minus the noise injected at that sink. A negative slack indicates the possibility of a functional failure at that net. For nets with multiple sinks, the sink with the smallest noise slack is reported in pessimistic assumptions. Thus, noise filters are essential for an acceptable static timing methodology. Conventional methods filter small coupling capacitors and noise events with small delay impacts. However, this approach can lead to failures for data buses when all coupled nets move together in phase. Then, even small coupling events add up quickly to impact significant noise-induced timing changes.

The probability distribution of delay impact of coupled noise (i.e., statistics) should, therefore, not only take into consideration the process tolerance impacting coupling capacitance and resistance and transistors, but also the circuit's tolerance to slew (i.e., noisy transition) and arrival time relations, as well as the logic circuitry's tolerance to switching direction and activity.

These statistics are modified by regular circuit designs, such as data buses in which the same logic flow forces all nets to switch together. Other exceptions include clock nets which exhibit very high activity, mostly switching with every cycle.

As such, a proper statistical treatment and analysis of coupled noise should preferably take these exceptions into account. Therefore, there is a need to provide a coupled noise analysis technique which accounts for various parameters presently unaccounted for in conventional techniques.

SUMMARY

In view of the foregoing, an embodiment of the invention provides a method of performing microelectronic chip timing analysis, wherein the method comprises identifying failing timing paths in a chip; prioritizing the failing timing paths in the chip according to a size of random noise events occurring in each timing path; attributing a slack credit statistic for all but highest order random noise events occurring in each timing path; and calculating a worst case timing path scenario based on the prioritized failing timing paths and the slack credit statistic. Preferably, the random noise events comprise non-clock events. Moreover, the random noise events may comprise victim/aggressor net groups belonging to different regularity groups. Preferably, the size of random noise events comprises coupled noise delta delays due to the random noise events occurring in the chip.

The prioritizing of the failing timing paths in the chip preferably comprises sorting a timing impact of the random noise events occurring in the chip by an occurrence of an event and a probability that the event will occur. Additionally, the prioritizing of the failing timing paths in the chip may comprise calculating a time delay change for each victim net influenced by at least one aggressor net connected to the victim net through at least one coupling capacitor; analyzing a netlist of the chip by grouping logically similar timing paths together; and performing a timing run to identify positive slack nets and negative slack nets, wherein the calculating of the worst case timing path scenario preferably comprises determining whether grouped victim nets and aggressor nets are switching in a same clock cycle.

Another embodiment of the invention provides a system for performing microelectronic chip timing analysis, wherein the system comprises a simulator adapted to identify failing timing paths in a chip; a processor connected to the simulator, the processor being adapted to prioritize the failing timing paths in the chip according to a size of random noise events occurring in each timing path; an analyzer connected to the processor, the analyzer being adapted to attribute a slack credit statistic for all but highest order random noise events occurring in each timing path; and a calculator connected to the processor and the analyzer, the calculator being adapted to calculate a worst case timing path scenario based on the prioritized failing timing paths and the slack credit statistic. Preferably, the random noise events comprise non-clock events and victim/aggressor net groups belonging to different regularity groups. Moreover, the size of random noise events may comprise coupled noise delta delays due to the random noise events occurring in the chip.

Additionally, the processor is preferably further adapted to sort a timing impact of the random noise events occurring in the chip by an occurrence of an event and a probability that the event will occur. Furthermore, the processor may further be adapted to calculate a time delay change for each victim net influenced by at least one aggressor net connected to the victim net through at least one coupling capacitor; analyze a netlist of the chip by grouping logically similar timing paths together; and perform a timing run to identify positive slack nets and negative slack nets, wherein the calculator may be adapted to determine whether grouped victim nets and aggressor nets are switching in a same clock cycle.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
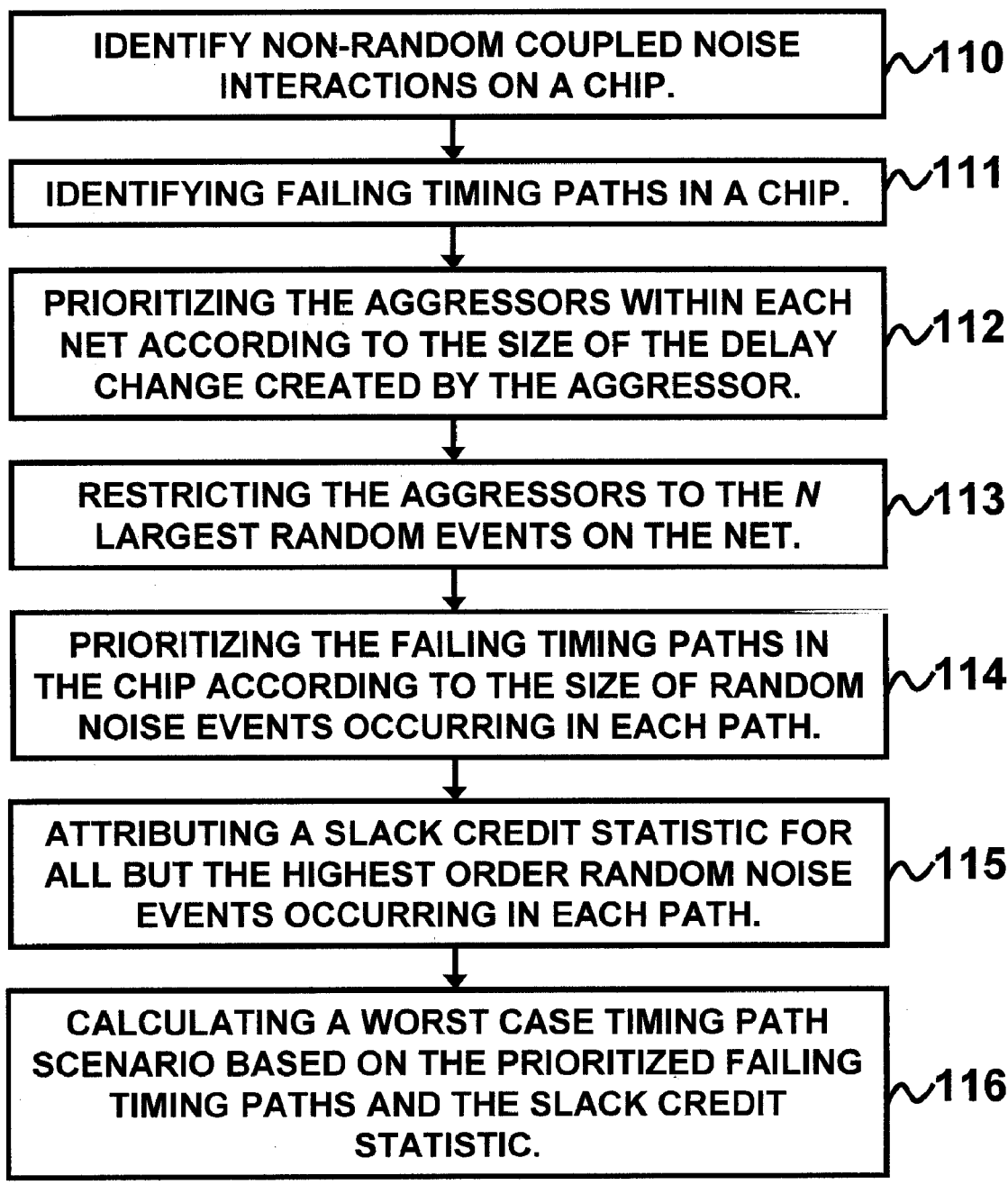
FIG. 1 is a flow diagram illustrating a preferred method according to an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need to provide a coupled noise analysis technique which accounts for various parameters presently unaccounted for in conventional techniques. The embodiments of the invention achieve this by providing a technique that focuses on the important noise events by investigating the distribution of the contributors to the timing path noise. Important noise events and the nets associated with these type of events are characterized by: (a) determining if nets are random data, (b) by determining the magnitude of coupling induced delay change, and (c) by ordering (b) using information from (a) via path tracing.

Figure 2:
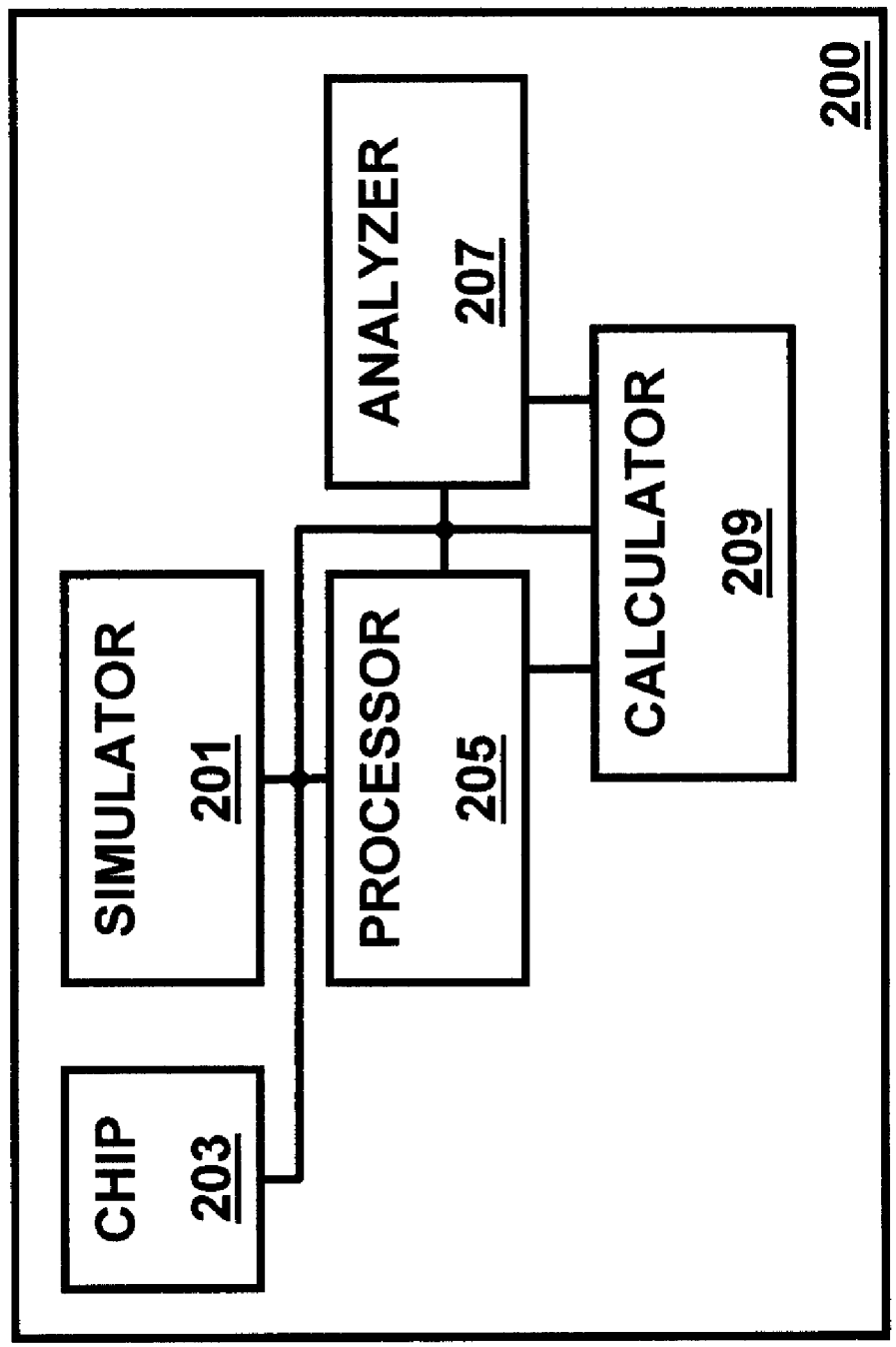
FIG. 2 is a system diagram according to an embodiment of the invention.
Figure 3:
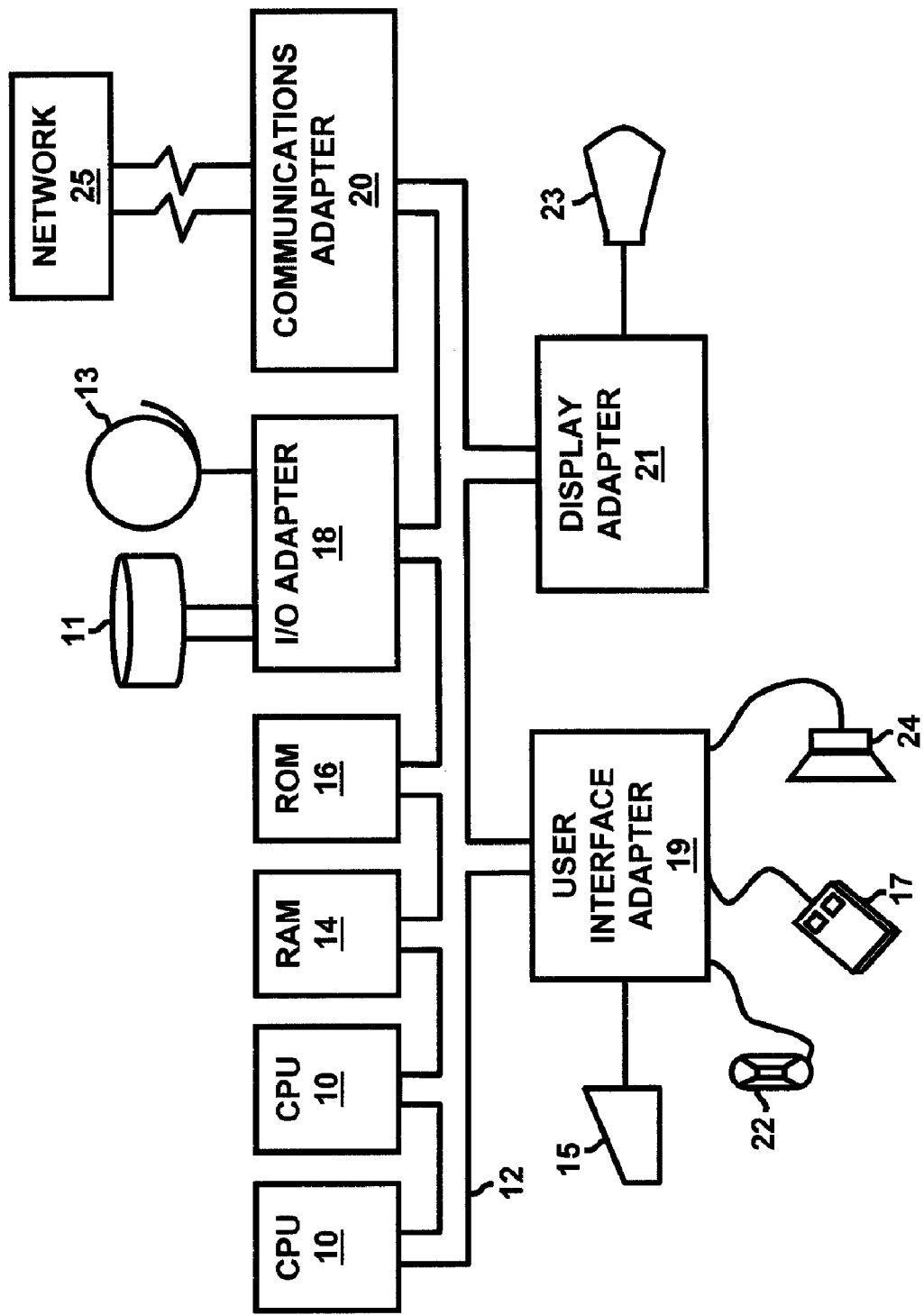
FIG. 3 is a computer system diagram according to an embodiment of the invention.

Referring now to the drawings and more particularly to FIGS. 1 through 3 where similar reference characters denote corresponding features consistently throughout the figures, there are shown preferred embodiments of the invention. According to the embodiments of the invention, one sorts or prioritizes nets by the timing impact of single events, calculates the probability for the event to occur, and then uses the largest events along a full timing path to determine the pessimistic assumption of a particular chip. In this regard, an event is determined by calculating the coupling induced delay impact (delta delay) on a net. The "largest events" are defined by numerically ordering (largest to smallest) the delta delay for nets in a path.

Before the specific steps of the embodiments of the invention are carried out, industry standard noise filters, which are well-known to those skilled in the art, are applied. The coupling capacitances that are smaller than a small threshold (for example, 0–10 femtofarad) are transferred into load capacitances, hence removed from the noise analysis. Furthermore the noise events that are smaller than a small threshold (for example, 0–10 picoseconds) are removed from further consideration. After this a circuit statistics based filter methodology is applied according to the embodiments of the invention, and as further described below.

FIG. 1 illustrates a method of performing microelectronic chip timing analysis according to an embodiment of the invention, wherein the method comprises (110) identifying all non-random coupled noise interactions. This step includes two sub-steps: the use of regularity extraction to find data buses in the netlist, whereby the coupling capacitances tied to nets identified as regular and equivalent in the netlist are excluded from the pool of random interactions. Second, the coupling capacitances tied to clock nets are excluded. The next step (111) finds all nets, giving negative slack with the most pessimistic assumption, that all remaining random noise events, which are larger than the first threshold, are hurting the performance of a slow path and helping the performance of a fast path. The nets in these paths are analyzed separately. The aggressor nets contributing to noise events on these nets are ordered (112) according to the size of the delay change caused by the aggressor and all but the largest N aggressors are removed (113) from further analysis. Thereafter, the full paths are tested and only those, which still have negative slack, are further analyzed, wherein the nets of these path in which noise events happen are prioritized (114) according to the size of the noise induced delay change and slack credit is given (115) for all but the N largest delay changes (115). This step on a path basis is similar to the previously described step for a single net. The remaining negative slacks are considered fails and are fixed. Thereafter, a worst case timing path scenario is calculated (116) based on the prioritized failing timing paths and the slack credit statistic.

The strength of this approach can be seen, when one considers that each net can easily have 20 significant aggressors and each path has 20 to 100 nets. Accordingly, the statistical approach provided by the embodiments of the invention provides a very good prioritization of noise events and helps to balance design effort with a small remaining risk.

Specifically, the method of performing chip timing analysis, according to the embodiments of the invention, comprises first, calculating the signal delay change for each victim net due to the influence of aggressor nets connected to the victim through coupling capacitors. There can be several aggressor nets for each victim net. The signal delay change is determined as follows. The switching aggressor transfers a multiple of the coupling capacitance on to the switching—or quiet in the case of false switching analysis—net capacitance load. The factor is determined out of the switching speed relationship and the timing window relationship as also typically performed in the industry standard noise analysis tools. The method of calculating this multiplication factor is optimized using detailed circuit analysis tools such as the well-known SPICE (Simulation Program for Integrated Circuits Emphasis) model developed by the Electronics Research Laboratory of the University of California, Berkeley. Traditionally, SPICE simulations have been used to estimate cross-talk noise in the signal lines.

This switching impacts the source cell delay due to a change in load capacitance, wire or interconnect delay, and also impacts the sink cell delay due to the slew change at the input of the sink cell. This occurs because, for coupling nets switching in the same direction, the coupling capacitance is subtracted from the circuit capacitance. For coupling nets switching in opposite directions, the coupling capacitance is added to the circuit capacitance. This change in capacitance thereby changes the delay of the circuit. The amount of coupling capacitance added/subtracted is then multiplied by a numerical scaling factor (k-factor), which is determined by a numerical timing comparison between the victim/aggressor nets (determines if the switching events occur at the same timing by use of timing windows). All three delay changes are combined to produce the delay change of noise events on a single victim net. Delay changes smaller than a threshold value of, for example, a timing value of 10 picoseconds, are neglected by forcing all coupling multipliers (i.e., "k-factors") for all aggressors to this net to 1. The embodiments of the invention treat the coupling capacitance as a capacitance to ground, thereby eliminating the addition/subtraction of coupling capacitance to that of the circuit capacitance. This is equivalent to setting the k-factor scaling variable to 1.

The second step involves using regularity extraction. In this step, the netlist of a chip is analyzed and identical paths, which are logically similar but are not necessarily physically/structurally similar, are placed into groups. In this regard, identical paths are paths that have the same nets connected with the same ports over a set number of stages. Paths in the same groups can switch together over several stages (for example, data buses, but not necessarily latch-to-latch). This means that a stage would be data net1 output connecting to data net2 input, etc. A data bus would be several of the logically equivalent stages. Hence, when data scans in the output of the design, multiple bits would switch at the same time through these equivalent stages. In this context, "latch-to-latch" refers to the data path connected between a launching storage element and a capturing storage element.

When paths are connected with coupling capacitances they switch together and add or subtract their coupled noise events. Preferably, the connection is through charge transfer across wires, which is physically modeled with coupling capacitance by a parasitic extraction tool. Therefore, cases in which victim and aggressor nets are in the same regularity group are not treated like random logic in noise analysis because they both have similar logic stages which would imply they are grouped below to a data bus. Rather, all of these events are added to worst case delays by receiving coupling affects on their circuit load.

Another group of nets, the clock nets, require special pessimistic treatment because a clock net accounts for a significant fraction of the system power dissipation as it switches most frequently and is generally a large net and is always active, while regular logic has an activity coefficient stating after how many cycles the logic state changes its value. Activity coefficients are generally between 0.1 and 0.2 indicating that clock nets are much more efficient as aggressors. This means they will be active aggressors always switching, wherein their activity coefficient is 0.1. For a clock, victim noise is a source of clock skew because the coupling induced timing delay will cause new signal arrival times at different storage elements. This difference in arrival times is equivalent to skew in the clock, thereby impacting many places of the design. Therefore, clock nets are also excluded from the next pessimism reduction because they switch all the time. Thus, statistically, the events will always happen, therefore they cannot be removed.

The third step involves a timing run with all larger noise events included, in such a way that the early timing path gets faster and the late timing path is slowed down. The timing run: (1) calculates delays through circuits and wires, (2) includes coupling capacitance changes in the circuit load thereby creating and early and late timing value, (3) delays are added along a path, and (4) tests are completed at pins comparing early/late signal arrival times. All endpoints with positive slack in this step have sufficient margin to meet timing requirements. This means that the slack calculated with a timing test results in a positive value, which indicates it has passed the timing requirements. Accordingly, the test will expose endpoints that fail (negative slack). As such, only negative slack tests are included in the next step.

Next, a common path pessimism analysis is performed on the negative slack endpoints. In this analysis the physically common nets are checked to see whether victim and aggressor nets are switching in the same clock cycle. If this is the case, then the coupled noise delta delay is the reason why this occurs assuming that the coupling induced delay is added up along nets in a path, and has caused significant degradation to the timing where the slack becomes negative.

The embodiments of the invention also provide the path analysis for random noise analysis and reduction. For this process, the path is traced and all coupled noise delta delays are ordered by size. This occurs from a data launch storage device to a data capture storage device, whereby the path is traced and nets which are do not belong to a regularity group have their coupling induced delay change (delta delay) numerically sorted with others in this path. The coupled noise delta delays are also compared with their regularity groups and checked for clock phase. In this context, regularity groups define several sets having logically equivalent stages. Slack credit, which is a timing value (adjustment) added to the timing slack, is given for all but the N largest random noise events, whereby N is a statistically determined value that states how many random data nets can actually switch at the same time.

In both of these steps it is preferred that the logic coming from the end latch is traced to ensure the most pessimistic conditions are analyzed. This occurs because a timing analysis engine (not shown) has cached away, in memory, timing information for all possible paths leading up to the endpoint. The timing tool (not shown) thereby analyzes all paths and keeps the worst path. Accordingly, the slack credit given in this last step significantly reduces the number of noise fails which need to be fixed because the coupling induced delay for the nets which do not belong to the N largest random noise events are added up along the path and this valued is provided as a positive adjustment (credit) to the slack.

Generally, the embodiments of the invention utilize filters in coupling capacitances, and restrict the number of aggressors and their delay impact of single noise events. A timing tool only analyzes the N (five, for example) largest (using coupling capacitance as a sorting metric) random noise events in coupling analysis. All other noise events are ignored. The filters are configured to filter coupling induced delay change (delta delay) and coupling capacitance. Regularity extraction, which is the process of identifying the groups of logically equivalent circuit stages, occurs to separate random logic design from data buses by identifying groups of logically equivalent circuit stages. Data nets that are contained in the results from this analysis belong to data buses, and data nets that are not contained in the results from this analysis are random.

Focus is drawn to the path-level on the largest noise events by crediting the timing slack for all other smaller events, with path tracing at the timing level. Specifically, the timing is propagated, coupling is introduced, the path is traced, random logic nets are identified and ordered by delta delay, and the sum of delta delays below the N largest random noise events are applied as a credit to the timing slack.

The embodiments of the invention do not require an up-front calculation of all arrival times of the data and clock signals. Rather, the embodiments of the invention calculate the worst case path with noise, and then trace the path to find the N-largest events, add the other events, and give credit for those other events. The technique provided by the embodiments of the invention allows one to restrict the timing paths used to the specific ones with negative slack under a pessimistic first run, and in this way avoids the need to test the full chip.

FIG. 2 illustrates a system 200 for performing microelectronic chip timing analysis, wherein the system 200 comprises a simulator 201 adapted to identify failing timing paths in a chip 203; a processor 205 connected to the simulator 201, wherein the processor 205 is adapted to prioritize the failing timing paths in the chip 203 according to a size of random noise events occurring in each timing path; an analyzer 207 connected to the processor 205, wherein the analyzer 207 is adapted to attribute a slack credit statistic for all but highest order random noise events occurring in each timing path; and a calculator 209 connected to the processor 205 and the analyzer 207, wherein the calculator 209 is adapted to calculate a worst case timing path scenario based on the prioritized failing timing paths and the slack credit statistic.

Preferably, the random noise events comprise non-clock events and victim/aggressor net groups belonging to different regularity groups. Moreover, the size of random noise events comprises coupled noise delta delays due to the random noise events occurring in the chip 203. Furthermore, the processor 205 is further adapted to sort a timing impact of the random noise events occurring in the chip 203 by an occurrence of an event and a probability that the event will occur.

Also, the processor 205 is further adapted to (a) calculate a time delay change for each victim net influenced by at least one aggressor net connected to the victim net through at least one coupling capacitor (not shown); (b) analyze a netlist of the chip 203 by grouping logically similar timing paths together; and (c) perform a timing run to identify positive slack nets and negative slack nets. Additionally, the calculator 209 is further adapted to determine whether grouped victim nets (not shown) and aggressor nets (not shown) are switching in the same clock cycle.

A representative hardware environment for practicing the embodiments of the invention is depicted in FIG. 3. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of performing microelectronic chip timing analysis, said method comprising:
   identifying failing timing paths in a chip;
   prioritizing said failing timing paths in said chip according to a size of random noise events occurring in each timing path, wherein said prioritizing of said failing timing paths in said chip comprises sorting a timing impact of random noise events occurring in said chip by an occurrence of an event and a probability that said event will occur;
   attributing a timing value for all random noise events occurring in each timing path except for a statistically determined number of the largest random noise events occurring in each timing path;

calculating a worst case timing path in said chin based on the prioritized failing timing paths and said timing value; and correcting only a portion of said chip comprising said worst cast timing path.

2. The method of claim 1, wherein said random noise events comprise non-clock events.

3. The method of claim 1, wherein said random noise events comprise victim/aggressor net groups belonging to different regularity groups.

4. The method of claim 1, wherein said size of random noise events comprises coupled noise delta delays due to said random noise events occurring in said chip.

5. The method of claim 1, wherein said statistically determined number indicates the number of random data nets in said chip that can switch simultaneously.

6. The method of claim 1, wherein said prioritizing of said failing timing paths in said chip comprises:

calculating a time delay change for each victim net influenced by at least one aggressor net connected to said victim net through at least one coupling capacitor;

analyzing a netlist of said chip by grouping logically similar timing paths together; and performing a timing run to identify positive slack nets and negative slack nets.

7. The method of claim 6, wherein said calculating of said worst case timing path comprises determining whether grouped victim nets and aggressor nets are switching in a same clock cycle.

8. A program storage device readable by computer, tangibly embodying a program of instructions executable by said computer to perform a method of performing microelectronic chip timing analysis, said method comprising:

identifying failing timing paths in a chip;

prioritizing said failing timing paths in said chip according to a size of random noise events occurring in each timing path, wherein said prioritizing of said failing timing paths in said chip comprises sorting a timing impact of random noise events occurring in said chip by an occurrence of an event and a probability that said event will occur;

attributing a timing value for all random noise events occurring in each timing path except for a statistically determined number of the largest random noise events occurring in each timing path;

calculating a worst case timing path in said chip based on the prioritized failing timing paths and said timing value; and correcting only a portion of said chip comprising said worst cast timing path.

9. The program storage device of claim 8, wherein said random noise events comprise non-clock events.

10. The program storage device of claim 8, wherein said random noise events comprise victim/aggressor net groups belonging to different regularity groups.

11. The program storage device of claim 8, wherein said size of random noise events comprises coupled noise delta delays due to said random noise events occurring in said chip.

12. The program storage device of claim 8, wherein in said method, said statistically determined number indicates the number of random data nets in said chip that can switch simultaneously.

13. The program storage device of claim 8, wherein in said method, said prioritizing of said failing timing paths in said chip comprises:

calculating a time delay change for each victim net influenced by at least one aggressor net connected to said victim net through at least one coupling capacitor;

analyzing a netlist of said chip by grouping logically similar timing paths together; and performing a timing run to identify positive slack nets and negative slack nets.

14. The program storage device of claim 13, wherein in said method, said calculating of said worst case timing path comprises determining whether grouped victim nets and aggressor nets are switching in a same clock cycle.

15. A system for performing microelectronic chip timing analysis, said system comprising:

a simulator adapted to identify failing timing paths in a chip;

a processor connected to said simulator, said processor being adapted to:

prioritize said failing timing paths in said chip according to a size of random noise events occurring in each timing path, and sort a timing impact of said random noise events occurring in said chip by an occurrence of an event and a probability that said event will occur;

an analyzer connected to said processor, said analyzer being adapted to attribute a timing value for all random noise events occurring in each timing path except for a statistically determined number of the largest random noise events occuring in each timing path;

a calculator connected to said processor and said analyzer, said calculator being adapted to calculate a worst case timing path in said chip based on the prioritized failing timing paths and said timing value, wherein said worst case timing path indicates the portion of said chip to be corrected.

16. The system of claim 15, wherein said random noise events comprise non-clock events and victim/aggressor net groups belonging to different regularity groups.

17. The system of claim 15, wherein said size of random noise events comprises coupled noise delta delays due to said random noise events occurring in said chip.

18. The system of claim 15, wherein said statistically determined number indicates the number of random data nets in said chip that can switch simultaneously.

19. The system of claim 15, wherein said processor is further adapted to:

calculate a time delay change for each victim net influenced by at least one aggressor net connected to said victim net through at least one coupling capacitor;

analyze a netlist of said chip by grouping logically similar timing paths together; and perform a timing run to identify positive slack nets and negative slack nets.

20. The system of claim 19, wherein said calculator is further adapted to determine whether grouped victim nets and aggressor nets are switching in a same clock cycle.

* * * * *